(12) United States Patent
Hao et al.

(10) Patent No.: US 7,122,862 B2
(45) Date of Patent: Oct. 17, 2006

(54) REDUCTION OF CHANNEL HOT CARRIER EFFECTS IN TRANSISTOR DEVICES

(75) Inventors: Pinghai Hao, Plano, TX (US); Shanjen Pan, Plano, TX (US); Sameer Pendharkar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/135,544

(22) Filed: May 24, 2005

(65) Prior Publication Data

US 2005/0215018 A1 Sep. 29, 2005

Related U.S. Application Data

(62) Division of application No. 10/670,434, filed on Sep. 23, 2003.

(51) Int. Cl.
*H01L 29/76* (2006.01)

(52) U.S. Cl. ............... 257/344; 438/302; 438/305

(58) Field of Classification Search ............... 257/344; 438/299, 301, 302, 305
See application file for complete search history.

(56) References Cited

U.S. PATENT DOCUMENTS

| 4,859,620 | A | * | 8/1989 | Wei et al. ............ 438/305 |
| 5,998,274 | A | * | 12/1999 | Akram et al. ......... 438/306 |
| 6,071,825 | A | * | 6/2000 | Deferm ............... 438/719 |
| 6,080,630 | A | * | 6/2000 | Milic-Strkalj et al. ...... 438/305 |
| 6,190,981 | B1 | * | 2/2001 | Lin et al. ............ 438/305 |
| 6,238,960 | B1 | * | 5/2001 | Maszara et al. ........ 438/197 |
| 6,346,447 | B1 | | 2/2002 | Rodder |
| 6,391,733 | B1 | * | 5/2002 | Fisher .............. 438/305 |
| 6,465,307 | B1 | | 10/2002 | Chidambaram et al. |
| 6,528,846 | B1 | * | 3/2003 | Nowak et al. .......... 257/328 |
| 6,548,874 | B1 | | 4/2003 | Morton et al. |
| 6,596,594 | B1 | * | 7/2003 | Guo ................ 438/279 |
| 6,822,297 | B1 | * | 11/2004 | Nandakumar et al. ...... 257/356 |
| 6,930,007 | B1 | * | 8/2005 | Bu et al. ............ 438/289 |
| 2003/0020125 | A1 | | 1/2003 | Mandelman et al. ...... 257/408 |
| 2004/0005763 | A1 | * | 1/2004 | Tseng et al. .......... 438/305 |
| 2004/0266122 | A1 | * | 12/2004 | Cheng et al. .......... 438/305 |

* cited by examiner

*Primary Examiner*—Matthew Smith
*Assistant Examiner*—Khiem D. Nguyen
(74) *Attorney, Agent, or Firm*—Wade James Brady, III; Frederick J. Telecky, Jr.

(57) ABSTRACT

A transistor can be fabricated to exhibit reduced channel hot carrier effects. According to one aspect of the present invention, a method for fabricating a transistor structure includes implanting a first dopant into a lightly doped drain (LDD) region to form a shallow region therein. The first dopant penetrates the substrate to a depth that is less than the LDD junction depth. A second dopant is implanted into the substrate beyond the LDD junction depth to form a source/drain region. The implantation of the second dopant overpowers a substantial portion of the first dopant to define a floating ring in the LDD region that mitigates channel hot carrier effects.

6 Claims, 3 Drawing Sheets

REDUCTION OF CHANNEL HOT CARRIER EFFECTS IN TRANSISTOR DEVICES

This application is a division of Ser. No. 10/670,434, filed Sep. 23, 2003.

TECHNICAL FIELD

The present invention relates generally to semiconductor devices and, more particularly, to an approach that can be employed to reduce channel hot carrier effects in transistor devices.

BACKGROUND

As transistor device densities continue to increase, minor fabrication and operational defects can have impact transistor operation inversely proportional with the size of the transistor. One of the well-known problems for small field effect transistors is channel hot carrier effects. For example, when a conventional metal oxide semiconductor field effect transistor (MOSFET) structure is scaled down to one micron or less, the potential energy of an electron changes dramatically when it hits the n+ drain boundaries. This sudden change in potential energy in a short distance tends to create a high electric field. This causes the electrons to behave differently within the semiconductor lattice. Electrons which have been activated by high electric fields are referred to as "hot electrons", and can, for example, penetrate into or through the gate dielectric. Electrons that penetrate into, but not through, the gate dielectric can cause the gate dielectrics to store charge over time, until the transistor ultimately fails.

Several techniques have been proposed to reduce hot carrier effects. One widely used technique is lightly doped drain extension regions, or "LDD" regions, in which a first light implant is performed before sidewall spacers are formed on the gate structure. After the sidewall spacers are in place, a second heavier implant is performed to form source/drain regions. The first implant provides only a relatively low conductivity in the silicon, so that the voltage has a gradient across the LDD region. This gradient helps prevent the voltage difference from appearing entirely at the junction of the drain and channel regions. The LDD region thus provides a region for the voltage gradient to occur, such that the peak electric field is reduced. This tends to reduce channel hot carrier (CHC) effects.

Another conventional technique that has been used is the "double doped drain." In this technique, for an n-channel transistor, the drain is implanted with both phosphorus and arsenic (or alternatively with both phosphorus and antimony.) Phosphorus diffuses faster, at a given temperature, than arsenic, and thus produces a slightly "fuzzy" drain profile. Again, this has the effect of stretching the voltage change at the drain boundaries, and this reduces the peak electric field, as is desirable.

Another known technique is to employ a thicker sidewall spacer along the edges of the gate structure. For example, after a gate structure has been formed, a further oxidation is commonly performed, to widen the oxide thickness at the lower corners of the gate. This has the effect of slightly increasing the separation between the lower corners of the gate and the silicon substrate. This is usually done, however, primarily to compensate for any damage to the gate dielectric at the lower gate corners that may be caused by etching processes.

SUMMARY OF THE INVENTION

The present invention relates generally to fabrication of a transistor that may exhibit reduced channel hot carrier effects. One aspect of the present invention provides a method for fabricating a transistor structure that includes implanting a first dopant into a lightly doped drain (LDD) region to form a shallow region therein. The first dopant penetrates the substrate to a depth that is less than the LDD junction depth. A second dopant is implanted into the substrate beyond the LDD junction depth to form a source/drain region. The implantation of the second dopant overpowers at least a substantial portion of the first dopant to define a floating ring in the LDD region that mitigates channel hot carriers during operation of the transistor device.

This approach can be utilized to form n-channel and p-channel devices. For example, an n-channel complimentary metal oxide semiconductor (CMOS) transistor can be fabricated according to an aspect of the present invention by forming the shallow region with a p-type dopant or an n-type dopant having a lower concentration than that of the associated n-type LDD region. For the example of a p-channel CMOS transistor, the shallow region can be formed by implanting an n-type dopant or a p-type dopant having a lower concentration than the associated p-type LDD region.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates generally to a metal oxide semiconductor field effect transistor (MOSFET) that mitigates channel hot carriers or hot electrons. This is achieved by employing a shallow floating structure generally aligned around a channel region of the transistor. The shallow floating structure can be formed within the LDD region of the transistor, such as by implantation, to resist creation of hot carriers. As a result, a transistor employing such structure can be capable of exhibiting improved performance over an extended lifetime.

Figure 1:
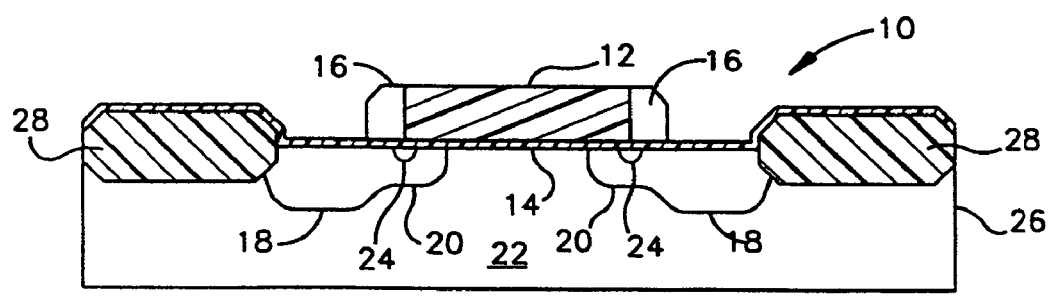
FIG. 1 illustrates a cross-sectional view of a transistor in accordance with an aspect of the present invention.

FIG. 1 depicts a schematic cross-sectional view of a transistor 10 in accordance with an aspect of the present invention. The transistor 10 can be a p-channel transistor or an n-channel transistor. For purposes of simplicity of explanation, the following discussion of FIG. 1 will assume an n-channel transistor, such as an NMOS. The transistor 10 includes a gate structure 12 that is disposed over a gate dielectric layer 14. To form the gate structure 12, a corresponding area is patterned and then later doped. The gate structure 12 can include a poly silicon gate (e.g., polygate). The poly gate is doped to render it conductive, such as through diffusion of ion implantation. The particular doping of the polygate may depend on the type of device (e.g., whether it is an n-channel or p-channel device Sidewall spacers 16 are formed along side the gate structure 12 such as by spacer oxide deposition and subsequent etch back. Channel hot carrier effect can be further reduced by employing large sidewall spacers 16 (e.g., extending laterally an increased width from the gate structure). Source/drain regions 18 are formed on the lateral sides of the gate structure 12 and spacers 16. Lightly doped drain regions (or source/drain extensions) 20 are formed to the edge of a channel region 22 over which the gate structure 12 is formed, also laterally of the channel region. The LDD regions 20 help mitigate high electric fields that may be present between the junction and channel regions during normal transistor operation. Thus, the LDD region 20 provides a concentration gradient between the higher concentration in the source/drain regions 18 and the lower concentration in the corresponding channel region 22. The gradient of the LDD regions 20 decreases the electric field between the junction and the channel regions.

In accordance with an aspect of the present invention, the transistor 10 also includes a floating region 24 within in the LDD region 20 operative to further mitigate hot carrier effects. The floating region 24 extends from a location at or near the surface of the substrate to a depth that is less than the junction depth of the LDD region. The floating region 24 can be a ring substantially self-aligned with a side edge portion of the gate structure. For instance, as the size of transistor structures continues to reduce to achieve higher device densities on integrated circuits, the use of conventional LDD regions are becoming less effective in reducing hot carrier effects. Additionally, as smaller transistor structures are being fabricated, channel hot carrier effects can increase over time causing permanent damage to the transistor structure. For example, a requisite drive current at fabrication time can shift over time due to channel hot carriers. The use of a floating region 24, in accordance with an aspect of the present invention, can further reduce channel hot carriers as device densities continue to increase. This affords improved performance.

The floating region 24 can be formed by implanting suitable dopant at a lower dose than the dose of dopant utilized to form the LDD region 20. This provides for a shallower, lighter doped region within the LDD region 20. In the example of FIG. 1, the floating ring extends from at or near a surface of the substrate 26 to a depth that is less than the junction depth of the LDD region 20. By way of example, for an NMOS transistor, the floating region 24 can be implemented as boron ($B_{11}$ or $BF_2$), as well as any other p-type dopant. The finial doping level of the floating region 24 can be either P type or still n type with reduced concentration relative to the concentration of the LDD region 20. Formation of the source/drain regions 18 overpowers the lightly doped portions that are implanted with the floating region 24 due to higher doping level of the source/drain region than the floating region 24.

The source/drain region 18 penetrates into the substrate 26 generally between the sidewall spacer 16 and an adjacent field oxide region 28. The implantation of the source/drain implants causes the floating region to form as a ring structure in the LDD regions 20 substantially self-aligned with the gate edge. The transistor structure 10 can be formed between adjacent field oxide regions 28.

FIGS. 2 through 7 illustrate various parts of a process that can be utilized to fabricate a transistor in accordance with an aspect of the present invention. Those skilled in the art will understand and appreciate that many or all portions of the process can be implemented with a CMOS or Bi-CMOS process. Additionally, while the following process steps will be described mainly with respect of forming an n-channel MOSFET structure, those skilled in the art will understand and appreciate that a p-channel structure also could be fabricated in accordance with an aspect of the present invention. Additionally, it is to be understood and appreciated that the particular order shown in the figures can be deviated and still produce a transistor device in accordance with an aspect of the present invention.

Figure 2:
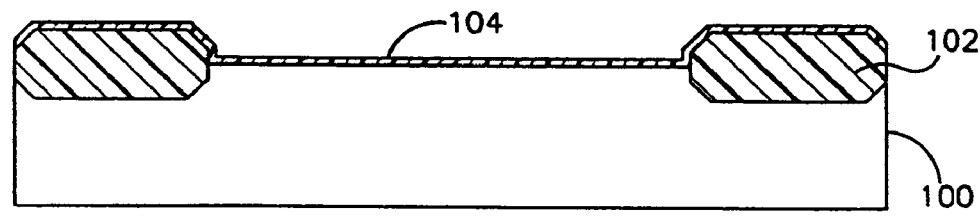
FIG. 2 illustrates a cross-section view of a substrate after field oxide and gate oxide layers are formed over the substrate in accordance with an aspect of the present invention.

Turning to FIG. 2, the process begins by providing a substrate layer 100. The substrate 100 can be formed from a semiconductor material, such as silicon or polysilicon. The substrate layer 100, however, could be formed from any material, such as gallium arsenide, germanium, silicon-germanium, epitaxial formations, silicon carbide, indium phosphide, silicon-on-insulator substrates (SOI), strained Si substrates, and/or other semiconductor substrate materials. For the example of an n-channel MOSFET, the substrate can be a p-type substrate layer or p-type epitaxial layer.

Also depicted in FIG. 2 is a patterned field oxide layer 102. The field oxide layer 102 can be formed using local oxidation of silicon (LOCOS) or shallow trench isolation (STI) techniques, for example. The resulting structure can be placed in a furnace and heated to oxidize exposed material to form the patterned field oxide layer 102.

A gate dielectric layer 104 is formed over the exposed substrate 100. The gate dielectric layer 102 can have a thickness according to the device dimensions, such as ranging from about 30 Å to about 300 Å. For example, 120 Å gate oxide is normally used for 5V application. A dry and/or wet thermal oxidation processing can form the gate dielectric layer 102. Thermal oxidation is the standard method of forming a gate dielectric layer having a thickness of about 30 Å to about 300 Å. It is to be appreciated that alternate methodologies besides thermal oxidation can be employed to form the gate dielectric layer. For example, any suitable technique (e.g., plasma enhanced CVD, thermal enhanced CVD and spin on techniques) may be employed in forming the gate oxide layer 104.

Additionally, alternate materials can be employed to provide the gate dielectric material. The gate dielectric material can be, for example, $SiO_2$ or another suitable oxide material that can perform the operation associated with the gate dielectric material. Examples of some materials that could be utilized as the gate dielectric layer 102 include $AlO_3$, $ZrO_2$, $HfO_2$ (AlHf) $O_X$, $HfO_2$, $La_2O_3$ and $Y_2O_3$ to name a few. Those skilled in the art will understand and appreciate appropriate types of deposition techniques that can be employed to grow suitable crystalline structures to form gate dielectric layers, such as those identified above.

Figure 3:
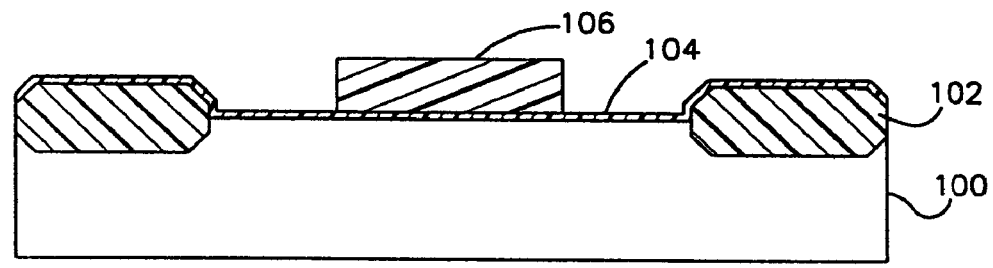
FIG. 3 illustrates a cross-sectional of the structure of FIG. 2 after forming a gate region in accordance with an aspect of the present invention.

FIG. 3 illustrates that a polysilicon gate (or polygate) 106 that can be formed over the dielectric layer 104. The polygate structure 106 can be formed via a series of deposition, patterning and etching steps. For example, one or more conductive layers are formed over the dielectric layer 104, such using any suitable technique including CVD techniques, such as LPCVD or PECVD (e.g., tetra-ethyl-ortho-silicate (TEOS)) followed by a reoxidation process. The polysilicon can be formed in a polycrystalline state or an amorphous state, which is later converted to a crystalline state. The polysilicon can also be formed using in-situ doping techniques and implantation techniques. The conductive layer is patterned and then etched (e.g., plasma dry etching or other dry and/or wet etching techniques) to form the gate structure 106. Following etching and formation of the gate structure 106, remaining patterned photoresist layer can be stripped (e.g., Ultra-Violet (UV)/Ozone ($O_3$)/Sulfuric Acid ($H_2SO_4$) and the structure can be cleaned by any suitable cleanup process.

Figure 4:
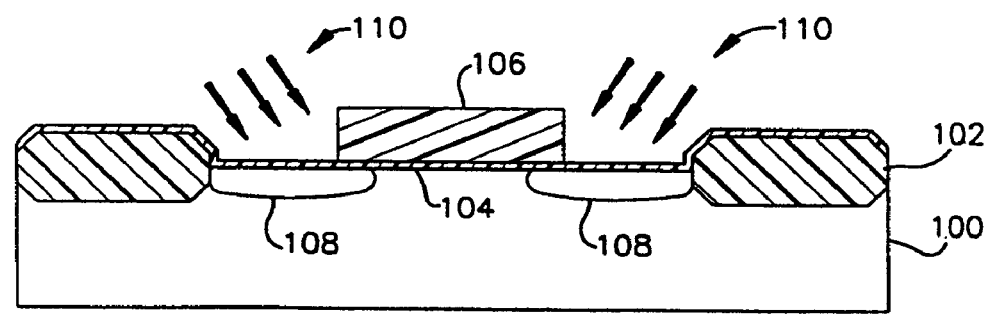
FIG. 4 illustrates a schematic cross-sectional view of the structure of FIG. 3 associated with forming a lightly doped drain region in accordance with an aspect of the present invention.

FIG. 4 depicts formation of LDD regions 108 in the semiconductor substrate 100. The LDD regions are formed by selectively implanting a LDD implant (e.g., an n⁻ LDD implant), indicated at 110, along opposite sides of the polygate structure 106. The energy, dose and depth utilized to form the LDD implants 108 can be selected according to the type of structure being formed.

For example, the LDD region 108 can be formed by a tilted angle implant (e.g., about 45 degree) relative to the substrate surface and the gate dielectric 104. By utilizing a tilted angle implant, the LDD region 108 exhibits a desired increased amount of overlap with the polygate structure 106. To further increase the amount of overlap between the gate structure 106 and the LDD region 108, the LDD region 108 can be formed (e.g., by selective ion implantation through an appropriate mask) prior to forming the gate structure.

By way of example, the LDD region 108 can be formed by implanting phosphorous ($P_{31}$) at a dose in a range from about $1\ e^{13}\ cm^2$ to about $5\ e^{14}\ cm^2$ of at an energy in range from about 70 KeV to about 120 KeV (e.g., approximately 94 KeV). Other n-type dopants and energy levels could be utilized to form the LDD region 108, such as, for example, arsenic. Tilted angle implant results in the LDD regions 108 being formed beneath the polygate structure 106. It will be understood and appreciated that, alternatively, the implant 110 can be implemented substantially normal to the substrate surface. For an n-channel transistor, suitable n-type dopants could be utilized to form the LDD regions 108.

Figure 5:
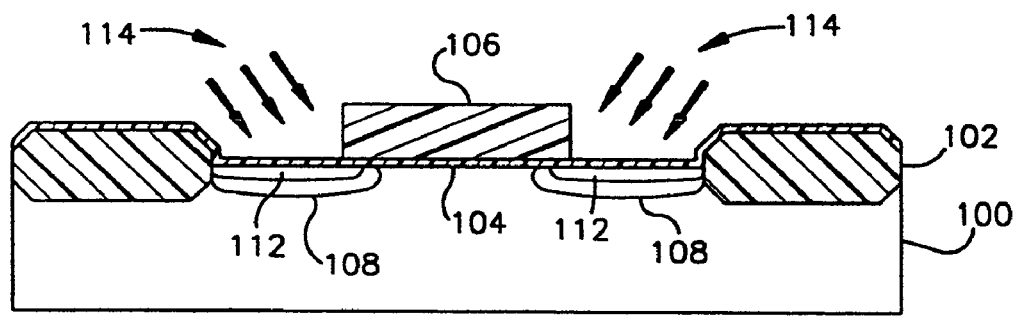
FIG. 5 illustrates a schematic cross-sectional view of the structure of FIG. 4 associated with forming a shallow region in accordance with an aspect of the present invention.

FIG. 5 depicts formation of a shallow region 112 within the LDD region 108. The shallow region 112 is formed by implanting a suitable dopant, indicated at 114, into the substrate. The dopant implantation 114 penetrates to a depth that is less than the junction depth of the LDD region 108 to form the shallow regions 112.

For the example of an n-channel transistor device, the shallow regions 112 can be formed with a p-type dopant. Alternatively, the shallow regions 112 can be formed by implanting an n-type dopant having a reduced concentration (e.g., an n⁻ implant) relative to the n-type dopant utilized to form the LDD regions 108. To result in the shallow region 112 penetrating into the substrate 100 to a junction depth that is less than that of the LDD region 108, the implantation 114 occurs at a dose that is less than the implant dose used to form the LDD region. For instance, to cause the shallow region to penetrate into the substrate 100 to a desired depth within the LDD region 108, the shallow region is normally implanted at a dose that is about twenty-percent or less of the dose implanted 112 to form the LDD region. Additionally, the floating region can be implanted at a dose that is higher than the dose implanted to form the LDD region as long as its junction depth remains less than (e.g., less than or equal to about half of) of the depth of the LDD junction. This typically provides for implanting a suitable dopant in a range from about $1\ e^{11}\ cm^2$ to about $1\ e^{13}\ cm^2$. For example, the shallow regions 112 can be formed by implanting boron diflouride ($BF_2$) at a dose of about $1\ e^{12}\ cm$ at 60 KeV. Alternatively, boron ($B_{11}$) can be implanted at a dose of $1\ e^{12}\ cm^2$ at 12 KeV, for example. The particular dose and energy for the shallow implant may vary according to the dose and energy of dopant implanted to form the LDD region.

Additionally, the implantation 114 of the dopants can be tilted angle implants (e.g., about 45 degrees), similar to that utilized in the implantation 110 of FIG. 4. Implants normal or at other angles relative to the substrate surface also could be utilized. For sake of process efficiency, the implantation 114 to form the shallow region 108 may employ the same mask (not shown) as utilized to form the LDD regions 108, such that little or no changes to the fabrication process are required.

Figure 6:
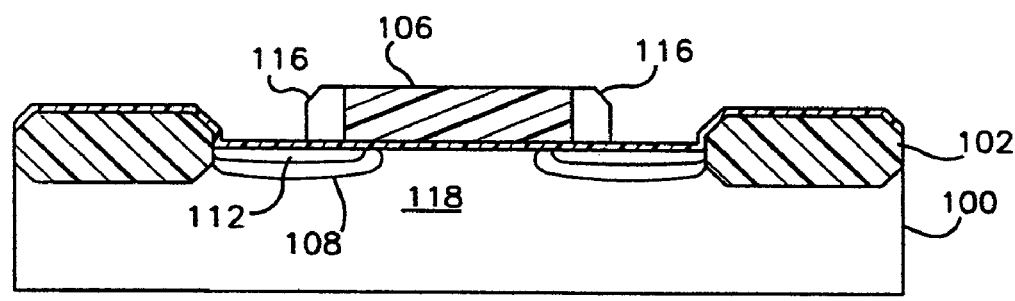
FIG. 6 illustrates a schematic cross-sectional view of the structure of FIG. 5 after forming sidewall spacers in accordance with an aspect of the present invention.

FIG. 6 depicts sidewall spacers 116 formed along side the polygate structure 106. Generally, the sidewall spacers 116 prevent subsequent source/drain implantation from penetrating too close to a channel region 118 beneath the polygate structure 106. In general, the formation of the sidewall spacers 116 involves two main process steps. A spacer oxide is deposited across the surface of the wafer, and then the oxide is etched back, such as by utilizing a dry etch process. The etch process ends when the polysilicon of the gate structure 106 is exposed. The spacer oxide etchback can utilize dry plasma etcher to remove most of the CVD oxide, which leaves behind the thicker sidewall spacers 116 on the sidewalls of the polygate structure 106, as depicted in FIG. 6.

Figure 7:
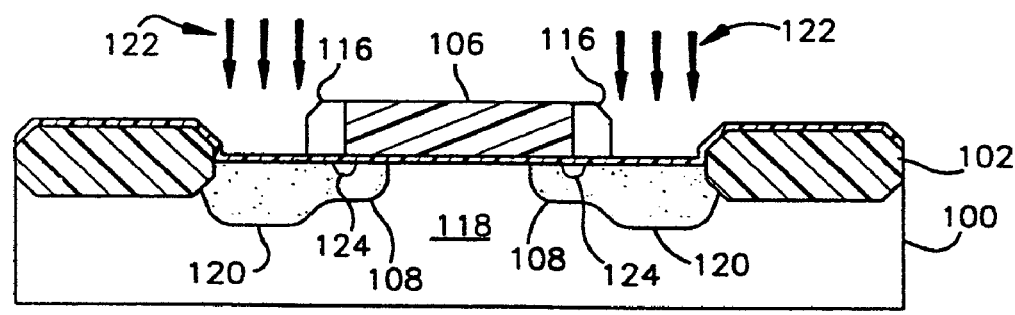
FIG. 7 illustrates a schematic cross-sectional view of the structure of FIG. 6 associated with forming source/drain regions in accordance with an aspect of the present invention.

FIG. 7 is a schematic cross-sectional view illustrating formation of source/drain regions 120. The source drain regions 120 are formed by selectively implanting medium-dose implant, indicated at 122, of suitable dopants that penetrate beyond the LDD junction depth. The sidewall spacers 122 operate as a mask to prevent source/drain implants from penetrating too close to the channels 118. In general, the formation of the source/drain regions 120 involve masking off areas (e.g., by a photoresist mask) to define the areas in which the source/drain implants are to be implanted. This is followed a medium-implant step that penetrates the silicon below the LDD junction depth. By way of example, for an n-channel transistor, an n⁺ source/drain implant (e.g., arsenic, $P_{31}$ or a combination thereof) can be utilized. For example, this can involve implanting a concentration of $4.0\ e^{14}\ cm^2$ of $P_{31}$ at 50 KeV followed by implantation of $3.0\ e^{15}\ cm^2$ of As at about 120 KeV. This medium-energy implant at such a dosage overpowers the shallow layer 112, causing formation of a floating ring, indicated at 124. The floating ring is formed at the junction of the LDD and gate regions substantially aligned with the side edge of the gate structure 106.

Because the shallow region 112 in FIG. 6 is implanted at a low dose than the source/drain regions 120, the portion of the shallow region distal the gate structure 106 will have little impact on the overall operation of the device 122 since the higher concentration of the source/drain region will dominate. The resulting structure depicted in FIG. 7 is similar to the structure shown and described in FIG. 1. After the source/drain implantation 122, the wafer can be annealed, such as in a rapid thermal process (RTP) tool. This helps prevent structures from spreading as well as helps control the diffusion of dopants in the source/drain regions.

Figure 8:
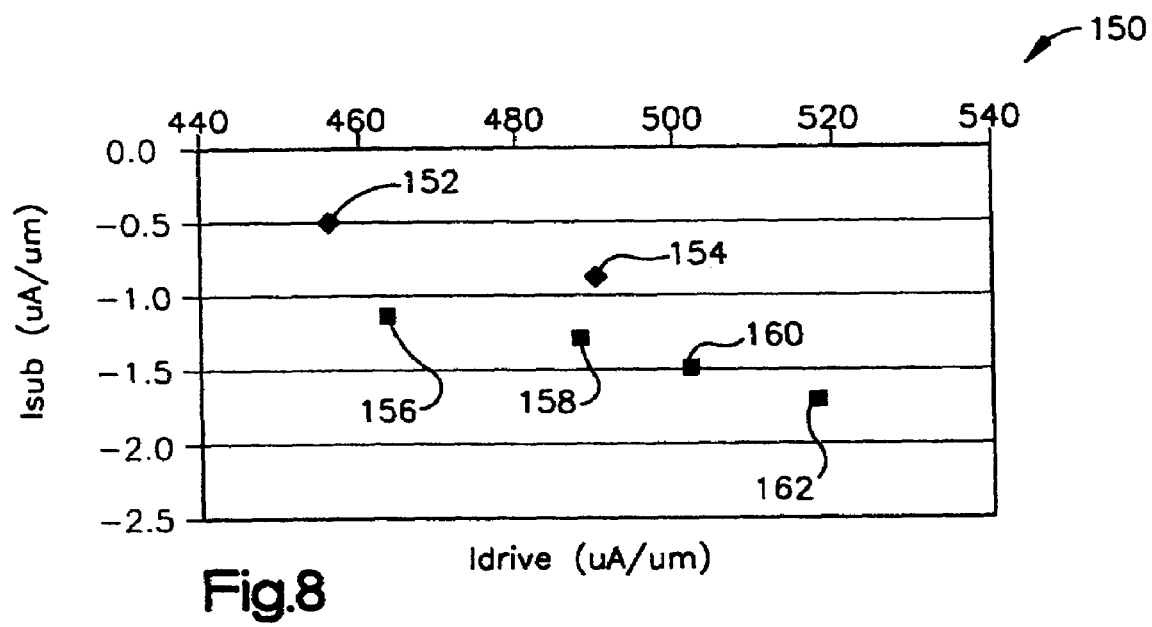
FIG. 8 is a graph illustrating a comparison of substrate current and drive current associated with different transistor structures.

FIG. 8 is a graph 150 illustrating relative substrate current $I_{SUB}$ to drive current $I_{DRIVE}$ ratios for several different transistor devices. In particular, points 152 and 154 represent transistor devices that include a shallow floating ring, such as can be fabricated in accordance with an aspect of the present invention. The point 152 represents the $I_{SUB}/I_{DRIVE}$ ratio for a transistor device that is formed by implanting a concentration of about $4 \: e^{13}$ cm$^2$ of $P_{31}$ to form the LDD region and a concentration of $6 \: e^{12}$ cm$^2$ of $BF_2$ to form a corresponding shallow region within the LDD region. The point 154 represents the $I_{SUB}/I_{DRIVE}$ ratio for a transistor device that is formed by implanting a LDD region with a concentration of $4 \: e^{13}$ cm$^2$ of $P_{31}$ plus a dose of $3 \: e^{12}$ cm$^2$ of $BF_2$ to form a shallow floating ring.

The other points 156, 158, 160 and 162 represent $I_{SUB}/I_{DRIVE}$ ratios for transistor devices formed in the absence of a floating ring as employed in the devices associated with points 152 and 154. The points 156–162 are fabricated with LDD regions of respectively increasing doses of $P_{31}$. For example, point 156 is formed with a dose of $3.2 \: e^{13}$ cm$^2$ of $P_{31}$, point 158 is formed with a dose $3.6 \: e^{13}$ cm$^2$ of $P_{31}$, point 160 is formed with a dose of $4.0 \: e^{13}$ cm$^2$ of $P_{31}$ and point 162 is formed with a dose of $4.4 \: e^{13}$ cm$^2$ of $P_{31}$.

From the graph 150, it is shown that for a given $I_{DRIVE}$ the substrate current $I_{SUB}$ is significantly reduced when the transistor is formed with a floating ring in the LDD region according to an aspect of the present invention. By way of example, even with a small dopant dose (e.g., about $3.0 \: e^{12}$ cm$^2$ of $BF_2$ associated with transistor represented by the point 154) utilized to form the floating ring, there is a significant reduction in $I_{SUB}$ when compared to the point 158. This reduction can be further increased by slightly increasing the dose of $BF_2$, such as to form a floating ring as indicated by the point 152.

In view of the foregoing those skilled in the art will understand and appreciate that by forming a shallow implant in the LDD region of a transistor (e.g., a P-type into an NMOS transistor, or an n-type into a PMOS transistor) a floating ring is formed that provides field relief around the gate edge of the transistor structure. As a result, channel hot carriers effect can be substantially mitigated. Further, it will be understood and appreciated that other methods of reducing channel hot carriers can be utilized in combination with the approach described herein. As mentioned above, the LDD region can be formed with a tilted angle implant. Additionally or alternatively, wider sidewall spacers can be formed along the polygate to further improve channel hot carrier effects. Another approach that can be utilized in conjunction with the shallow floating ring in the source/drain extension near the gate edge is to provide for further overlap of the drain structure by the gate. Another approach is to reduce the dose employed to form the LDD region.

Figure 9:
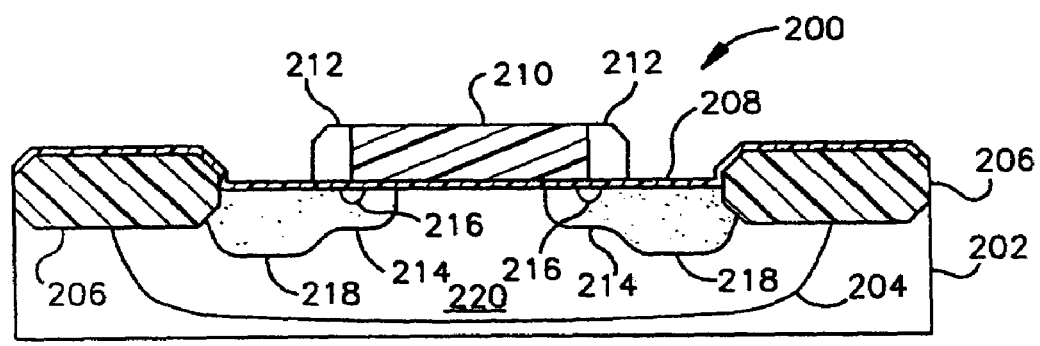
FIG. 9 illustrates a schematic cross-sectional view of another transistor structure in accordance with an aspect of the present invention.

FIG. 9 depicts a schematic cross-sectional view of another transistor structure 200 that can be fabricated in accordance with an aspect of the present invention. The transistor structure 200 can be a p-channel transistor or an n-channel transistor depending on the dopants utilized. For purposes of simplicity of explanation, the following discussion assumes that the structure represents a p-channel transistor, such as a p-MOSFET.

The transistor structure 200 is formed on a substrate layer 202 that can be formed from a semiconductor material, such as silicon or polysilicon. The substrate layer 202, however, could be formed from any material, such as gallium arsenide, germanium, silicon-germanium, epitaxial formations, silicon carbide, indium phosphide, silicon-on-insulator substrates (SOI), strained Si substrates, and/or other semiconductor substrate materials.

An n-well 204 is formed in the substrate 202. The n-well 204 can be formed by implanting an n-type dopant, such as phosphorous and/or arsenic, into the p-type substrate layer 202. For example, a patterned photoresist layer (not shown) can be used as a mask to define the area of the n-well 204. The implantation of the n-type dopant 104 can be performed, for example, using an ion implanter that accelerates the dopant ions (e.g., $P_{31}$) at a high energy (e.g., about 150 to about 250 KeV). Alternatively, to form an n-channel transistor, the well could be formed as a p-well by implanting suitable p-type dopants into the substrate 202. After ion implantation, the patterned photoresist can be stripped off the substrate 202 (e.g., Ultra-Violet (UV)/Ozone ($O_3$)/Sulfuric Acid ($H_2SO_4$) and cleaned using suitable cleanup processes.

The transistor structure 200 includes field oxide regions 206 formed on the substrate. The n-well 204 generally extends between the adjacent field oxide layers 206, such as shown in FIG. 9. A gate dielectric layer 208 is formed over the exposed substrate surface and the field oxide regions 206. The gate dielectric can be formed via any suitable deposition technique (e.g., plasma enhanced CVD, thermal enhanced CVD and spin on techniques) and can be formed of any suitable dielectric material, such as mentioned above.

A gate structure 210 is formed over the gate dielectric 208 between the field oxide regions 206. The gate structure 210 can comprise, for example, a polysilicon gate material or a re-crystallized polysilicon gate material. Sidewall spacers 212 are formed along the side edges of the gate structure 210. Typically, LDD regions 214 are formed prior to formation of the sidewall spacers 212. The implantation for the LDD regions 214 can be performed using an ion implanter that initially accelerates a p⁻ lightly doped drain implants (p⁻ LDD implants) into the n-well 204. The p⁻ LDD implants can comprise p-type dopants, such as $B_{11}$, and/or $BF_2$. Those skilled in the art will understand and appreciate that other dopants can be used as the p⁻ LDD implant.

A floating ring 216 of a suitable dopant is formed in the LDD region 214 to mitigate hot carrier effects. The floating ring 216 can be formed by implanting suitable dopant at normally a lower dose than the dose of dopant utilized to form the LDD region 214. This provides for lighter doped region within the LDD region 214 that penetrates the substrate to a junction depth that is less than the junction depth of the LDD region.

By way of example, for a PMOS transistor, the floating ring 216 can be implemented as arsenic, phosphorous s well as any other n-type dopants. The dose of implant utilized to form the floating ring 216, for example, can normally be about twenty-percent or less of the dose of the dopant implanted to form the LDD region 214. Additionally, the floating ring can be implanted at a dose higher than the implanted dose used to form the LDD region as long as the junction depth of the floating ring remains less than (e.g., less than about half) the depth of the LDD junction.

Following (or before) formation of the LDD region 214, the n-well can be implanted with a medium to high dose of source/drain implant (e.g., p⁺), such as $B^{11}$, and/or $BF_2$. The source/drain implant penetrates the n-well slightly below the LDD junction depth to define source/drain regions 218 with a high impurity content. Implantation of the source/drain implants overpowers the lightly doped portions of a shallow region formed with the floating ring 216 (e.g., into the source/drain regions 218). This results in the portion of the shallow region located beneath the sidewall spacer 212 and the gate structure 210 remaining to form the floating ring 216. As depicted in FIG. 9, the floating ring 216 is substantially aligned with the side edges of the gate structure 210.

The use of a floating ring 216 in the transistor structure 200 provides field relief around the gate edge of the transistor, which results in reduced channel hot carriers. The benefits of this approach exist even as device densities continue to increase. This approach further can be combined with existing approaches used to reduce channel hot carriers, such as described herein, to further improve channel hot carrier effects. This affords improved performance and an extended lifetime for transistors implementing such structure.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A transistor structure, comprising:
    a substrate;
    a gate structure on the substrate, the gate structure having side edges;
    a channel region in said substrate beneath said gate structure;
    a lightly doped drain (LDD) region in the substrate laterally of said channel region and extending beneath said gate structure;
    a source/drain region in said substrate extending to said LDD region; and
    a floating ring at the junction of said source/drain region and said LDD disposed completely within said LDD, source/drain region and the surface of said substrate and substantially aligned with the side edges of the gate structure to mitigate channel hot carrier effects, wherein the floating ring having a dopant concentration that is less than the dopant concentration of the LDD region.

2. The transistor structure of claim 1 implemented as an n-channel CMOS transistor, the floating ring comprising a p-type dopant.

3. The transistor structure of claim 1 implemented as a p-channel CMOS transistor, the floating ring comprising an n-type dopant.

4. The transistor structure of claim 1, the floating ring extending from a surface of the substrate to a depth that is less than a junction depth of the source/drain region.

5. A transistor structure comprising:
    a substrate;
    a lightly doped drain (LDD) region in said substrate;
    a second dopant having a lower dopant concentration than that of the associated LDD region disposed in said lightly doped drain (LDD) region to a depth less than a LDD junction depth;
    a third dopant in said substrate extending into said substrate beyond a portion of the LDD junction depth providing a source/drain region, and
    a floating region at the junction of said LDD region and said source/drain region disposed completely within said LDD, source/drain region and the surface of said substrate.

6. The method of claim 5, the floating region substantially self-aligned with an edge of a gate of the transistor structure.

* * * * *